(12) United States Patent
Park

(10) Patent No.: US 7,839,705 B2
(45) Date of Patent: Nov. 23, 2010

(54) SEMICONDUCTOR MEMORY DEVICE AND OPERATION METHOD OF THE SAME

(75) Inventor: Mun-Phil Park, Kyoungki-do (KR)

(73) Assignee: Hynix Semiconductor Inc. (KR)

( * ) Notice: Subject to any disclaimer, the term of this patent is extended or adjusted under 35 U.S.C. 154(b) by 270 days.

(21) Appl. No.: 12/005,505

(22) Filed: Dec. 27, 2007

(65) Prior Publication Data

US 2009/0059692 A1 Mar. 5, 2009

(30) Foreign Application Priority Data

Sep. 4, 2007 (KR) ............... 10-2007-0089522

(51) Int. Cl.
*G11C 7/00* (2006.01)

(52) U.S. Cl. ............... 365/193; 365/230.06; 365/233

(58) Field of Classification Search ............... 365/193, 365/230.06, 233.1, 194, 233, 226, 185.11, 365/189.05, 189.09, 230.08, 239

See application file for complete search history.

(56) References Cited

U.S. PATENT DOCUMENTS 6,295,245 B1 * 9/2001 Tomita et al. ............ 365/189.16
6,317,369 B1 * 11/2001 Kubo et al. ............... 365/193
6,671,787 B2 * 12/2003 Kanda et al. ............. 711/167
7,414,899 B2 * 8/2008 Oh et al. .................. 365/193

FOREIGN PATENT DOCUMENTS

JP 2000-222879 8/2000

* cited by examiner

*Primary Examiner*—Dang T Nguyen
(74) *Attorney, Agent, or Firm*—Blakely, Sokoloff, Taylor & Zafman

(57) ABSTRACT

A semiconductor memory device has a timing margin for internal operations. The semiconductor memory device can activate an internal control signal for controlling an external address sooner than an internal control signal for controlling an external command to secure a sufficient time for data access. The semiconductor memory device includes a command decoding circuit configured to decode an external command to output an internal command signal for an internal operation corresponding to the external command, a control circuit configured to generate a strobe signal for controlling the internal operation in response to the internal command signal and an internal address signal by decoding an address signal received from outside such that the internal address signal activates sooner than the strobe signal, and a column decoding circuit configured to generate a data access signal when both the internal address signal and the strobe signal are activated.

21 Claims, 9 Drawing Sheets

SEMICONDUCTOR MEMORY DEVICE AND OPERATION METHOD OF THE SAME

CROSS-REFERENCE TO RELATED APPLICATIONS

The present invention claims priority to Korean patent application number 10-2007-0089522, filed on Sep. 4, 2007, which is incorporated by reference in its entirety.

BACKGROUND OF THE INVENTION

The present invention relates to a memory device, and more particularly to a memory device capable of obtaining a sufficient timing margin for a corresponding internal operation after receiving and decoding an external command and an address.

A semiconductor memory device is a kind of data storage. When a data is required by a data processor such as a central processing unit (CPU), the semiconductor memory device outputs the data corresponding to an address received from the data processor, or stores the data provided by the data processor in a position corresponding to the address.

As semiconductor integration technology advances and an operation speed of a system including semiconductor devices increases, there has been a demand for a more rapid semiconductor memory device. In order to increase operation speed and stability of a semiconductor memory device, internal circuits of the semiconductor memory device need to operate rapidly and transfer signals or data rapidly.

An operation of a semiconductor memory device may be delayed by control circuits for reading data stored in a unit cell or transferring data to the unit cell, and by connecting lines or connecting apparatuses for transferring the data. In addition, the operation may also be delayed while the data output from the semiconductor memory device is transferred to the apparatus requiring the data in the system. The delay in a high speed system may degrade system performance and may lower system stability and system reliability. The length of the delay in a data transfer path may possibly vary with operation conditions, which may have a bad influence upon the performance of the semiconductor memory device.

In general, as a data output is performed rapidly after receiving a read command in a read operation, the performance of a semiconductor memory device also improves. In particular, the time required to output data is as an important performance index of a semiconductor memory device used in graphics where a large amount of data such as image data are processed at high speed. As described above, the semiconductor memory device needs to operate more rapidly although its internal operations become more complicated. If the internal operations are not performed in time, the reliability of the semiconductor memory device will be lost.

FIG. 1A is a timing diagram of a read operation performed by a typical semiconductor memory device.

Referring to FIG. 1A, a read command RD input thereinto is decoded to generate a column selection signal YI. FIG. 1A shows a semiconductor memory device having a column address strobe (CAS) latency CL of 8, which means that data starts to be output from the semiconductor memory device through a data pad after 8 cycles of a system clock CLK/CLK# from when a read command RD was input thereinto.

Typically, the semiconductor memory device decodes the read command RD to activate an internal read command INTERNAL_RD and simultaneously activate a read column access signal CASP6RD and a read address latch strobe signal CASP6RD_ADD at the same time. The activation of the read column access signal CASP6RD and the read address latch strobe signal CASP6RD_ADD is synchronized with the system clock CLK/CLK# which serves as a reference in applying the address and the read command RD to the semiconductor memory device. Accordingly, a column address signal ADDRESS<3:8> generated by the read address latch strobe signal CASP6RD_ADD is activated at the time when the read column access signal CASP6RD is activated.

In more detail, the column address signals ADDRESS<3:8> each is generated after 1 tCK, i.e. after one cycle of the system clock, from when the read command RD was input. The column address signal ADDRESS<3:8> has an effective pulse width of 2 tCK according to a minimum interval tCCD between the read commands RD. Similarly, the read column access signal CASP6RD for generating the column selection signal YI is also generated after 1 tCK from when the read command RD was input, i.e., at the time when the column address signal ADDRESS<3:8> was generated. The read column access signal CASP6RD has a pulse width of 1 tCK, which is the same as that of the column selection signal YI.

The read column access signal CASP6RD is decoded to generate a column strobe signal STROBE. The column address signal ADDRESS<3:8> is decoded to generate a bank address BANK_ADD. The column pre-decoder and the column decoder generate a column selection signal YI in response to the column strobe signal STROBE and the bank address BANK_ADD to control a unit cell of a bank corresponding to the address received from outside. The column strobe signal STROBE corresponds to a command received from outside, and the bank address BANK_ADD corresponds to an address received from outside. A circuit outputting the column strobe signal STROBE into the column pre-decoder is different from that outputting the bank address BANK_ADD thereinto. That is, a circuit for decoding an external address received from outside to generate an internal address signal controlling an internal unit cell is different from a circuit for decoding an external command received from outside to generate an internal command signal controlling an internal operation corresponding to the external command.

As described above, the external command and the external address are decoded and are input into a column decoding circuit through different circuits. In other words, the internal command signal and the internal address are generated in different circuits. Accordingly, it is difficult to input the internal command signal and the internal address signal such as a column strobe signal STROBE and a bank address signal BANK_ADD into the column decoding circuit at the same time. Accordingly, an activation of the column strobe signal STROBE and an activation of the bank address may disagree with each other when they are input into the column pre-decoder. This may results in difficulties in determining an exact activation time of the column selection signal YI corresponding to the column strobe signal STROBE and the bank address signal BANK_ADD, and in providing a sufficient pulse width.

FIG. 1B is a timing diagram of a write operation performed by a typical semiconductor memory device. Referring to FIG. 1B, after a write latency WL from when a write command WT was input into the semiconductor memory device, a data is input thereinto through a data pad to be stored in a unit cell of the semiconductor memory device. FIG. 1B shows, for example, a semiconductor memory device when a write latency WL is 4 and a burst length BL is 8.

A data starts to be input into the semiconductor memory device after the write latency WL from when a write command WT was input into the semiconductor memory device.

During the clock cycles corresponding to the burst length BL from then, the data is input into the semiconductor memory device. After 1 tCK from then, a write column access signal CASP6WT and a write address latch strobe signal CASP6WT_ADD are simultaneously generated. The write address latch strobe signal CASP6WT_ADD and a column address signal ADDRESS<3:8> generated thereby are input into the column decoding circuit at the same time in synchronization with the system clock CLK/CLK# which serves as a reference in applying the address and the write command WT.

The write operation is similar to the read operation in that signals such as a write column access signal CASP6WT and a column selection signal YI has an active region of a width of 1 tCK, and the column address signal ADDRESS<3:8> has an effective window of a width of 2 tCK. However, the write operation differs from the read operation in that internal operations start after 1 tCK from receiving all corresponding data instead of starting after 1 tCK from when the write command WT was received.

Similarly to the read operation, a circuit generating a column strobe signal STROBE in response to a write column access signal CASP6WT is different from a circuit generating a bank address signal BANK_ADD in response to a column address signal ADDRESS<3:8>. Therefore, it is also difficult to input an internal command signal generated in response to the external command and an internal address signal generated in response to the external address such as the column strobe signal STROBE and the bank address signal BANK_ADD into the column decoding circuit at the same time.

In order to generate a column selection signal YI using a column strobe signal STROBE and a bank address signal BANK_ADD which are input at different times, an additional delay or synchronization circuit is required to control the column strobe signal STROBE and the bank address signal BANK_ADD. That is, input times of the column strobe signal STROBE and the bank address signal BANK_ADD are controlled to stabilize an activation time and an active region of a column selection signal YI. However, such a control greatly affects an address access time tAA. In addition, accuracy of such a control is greatly affected by operation conditions such as a process, a voltage level and a temperature. Accordingly, in a high speed semiconductor memory device such as a GDDR5 and DDR4, a timing margin for an internal operation in response to read and write commands received from outside may be reduced.

The above described method for decoding an external command and an external address to input them into internal circuits of a semiconductor memory device is a method for simultaneously generating an internal signal corresponding to the external command and that corresponding to the external address on the basis of the system clock. That is, when a CAS command for the external address and the external command is input into the semiconductor memory device, the column address signal ADDRESS<3:8> and the read or write column access signal CASP6RD or CASP6WT are simultaneously generated. However, as described above, the column address signal ADDRESS<3:8> and the read or write column access signal CASP6RD or CASP6WT are input into the column decoding circuit through different circuit paths. In addition, configurations and operations of the circuits for decoding respective signals and generating respective internal signals are different from each other. Therefore, the signals are input at different times into the column decoding circuit. This results in difficulty in guaranteeing an operational reliability when the semiconductor memory device operates at high speed.

SUMMARY OF THE INVENTION

Embodiments of the present invention are directed to providing a high speed semiconductor memory device having a timing margin for internal operations. In accordance with an aspect of the present invention, there is provided a semiconductor memory device which can activate an internal control signal for controlling an external address sooner than an internal control signal for controlling an external command to secure a sufficient time for data access.

In accordance with an aspect of the present invention, there is provided a semiconductor memory device including a command decoding circuit configured to decode an external command to output an internal command signal for an internal operation corresponding to the external command, a control circuit configured to generate a strobe signal for controlling the internal operation in response to the internal command signal and an internal address signal by decoding an address signal received from an external source such that the internal address signal activates earlier than the strobe signal, and a column decoding circuit configured to generate a data access signal when both the internal address signal and the strobe signal are activated.

In accordance with another aspect of the present invention, there is provided an operation method of a semiconductor memory device, the operation method including decoding an external command to output a CAS (column address strobe) command signal for an internal operation corresponding to the external command, generating a strobe signal for controlling the internal operation in response to the CAS command signal and an internal address signal by decoding an address signal received from an external source such that the internal address signal activates earlier than the strobe signal, and generating a data access signal when both the internal address signal and the strobe signal are activated.

As described above, in accordance with an aspect of the present invention, the semiconductor memory device may activate the internal control signal for controlling an internal operation corresponding to the external address signal sooner than the internal control signal for controlling an internal operation corresponding to the external command. This is configured to overcome a time lag between the two internal control signals when they are input into the column decoding circuit. The internal control signal corresponding to the external command generally has an active region a width of which is one cycle of a system clock. The internal control signal corresponding to the external address signal generally has an effective window a width of which is two cycles of a system clock according to a specification for a minimum interval tCCD between commands. Making use of this difference, the internal control signal related to the external address signal is activated prior to the activation of the internal control signal related to the external command so that a data can be accessed sufficiently during the active region of the internal control signal related to the external command. Particularly, the semiconductor memory device in accordance with an embodiment of the present invention can have a sufficient operation margin for data access and operate stably in spite of variations in operation conditions such as a process, a voltage level, and a temperature.

DESCRIPTION OF SPECIFIC EMBODIMENTS

Hereinafter, a semiconductor memory device and an operation method of the same in accordance with the present invention will be described in detail with reference to the accompanying drawings.

Figure 1A:
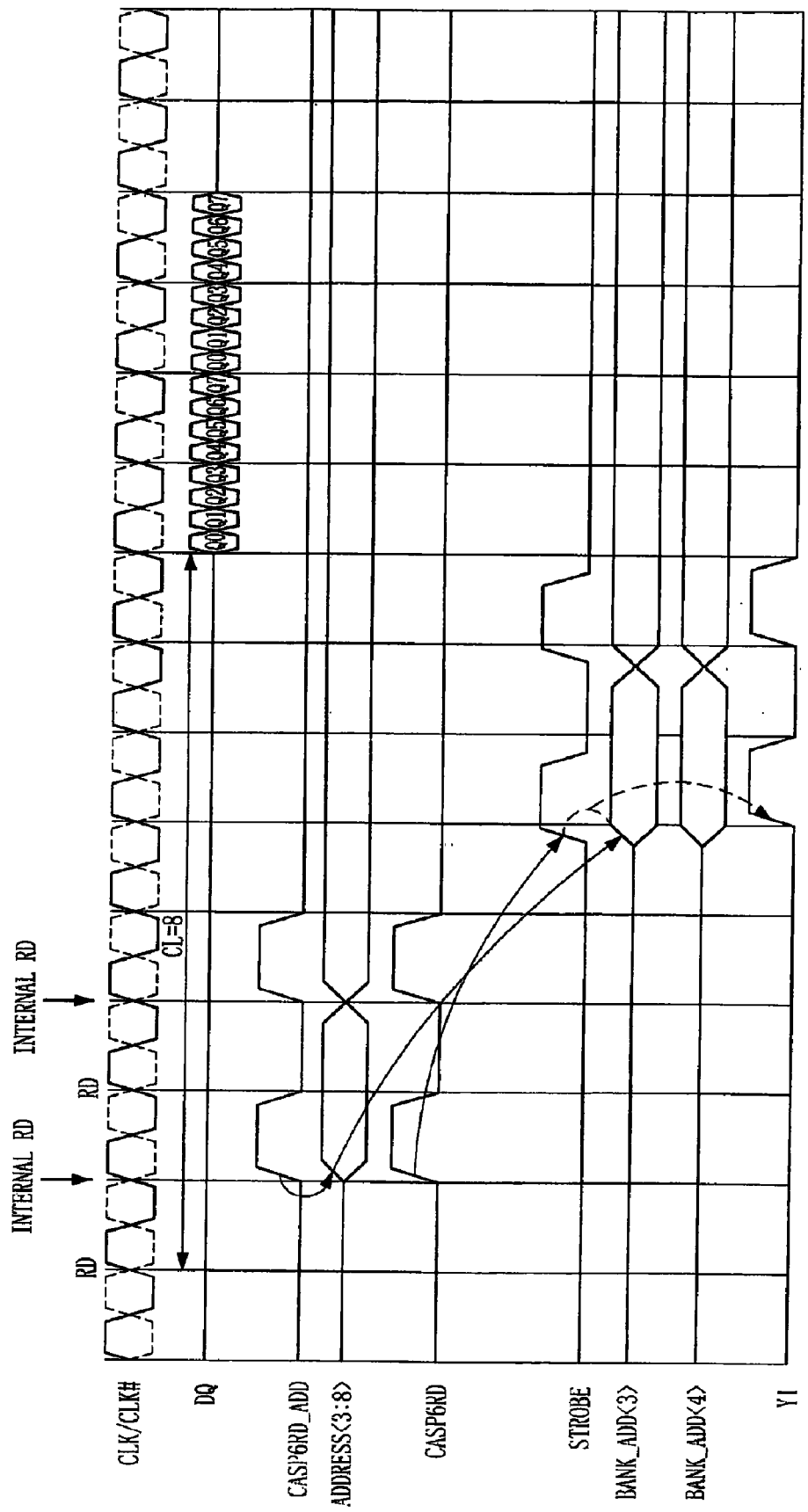
FIG. 1A is a timing diagram of a read operation performed by a typical semiconductor memory device.
Figure 1B:
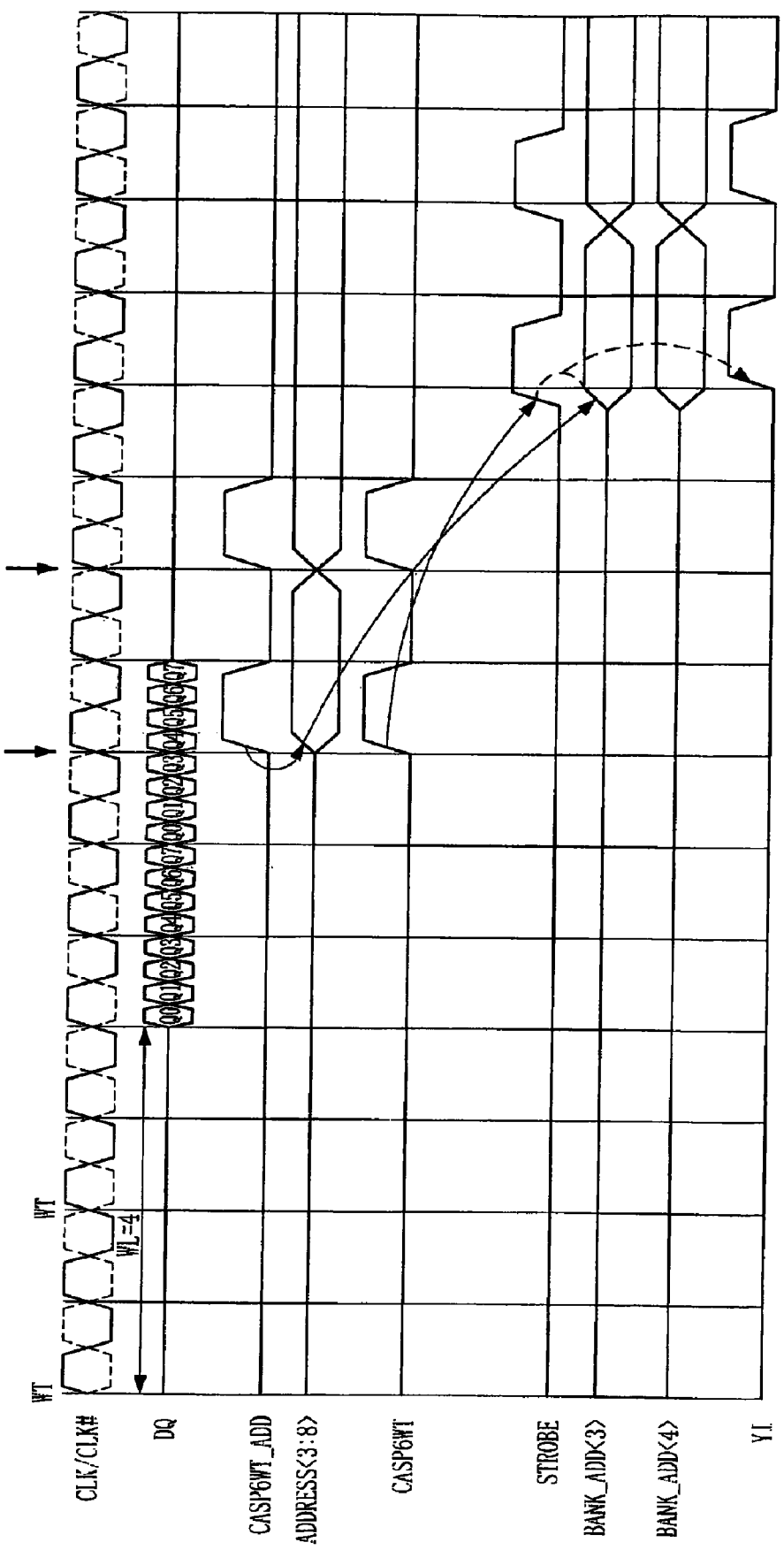
FIG. 1B is a timing diagram of a write operation performed by a typical semiconductor memory device.
Figure 2A:
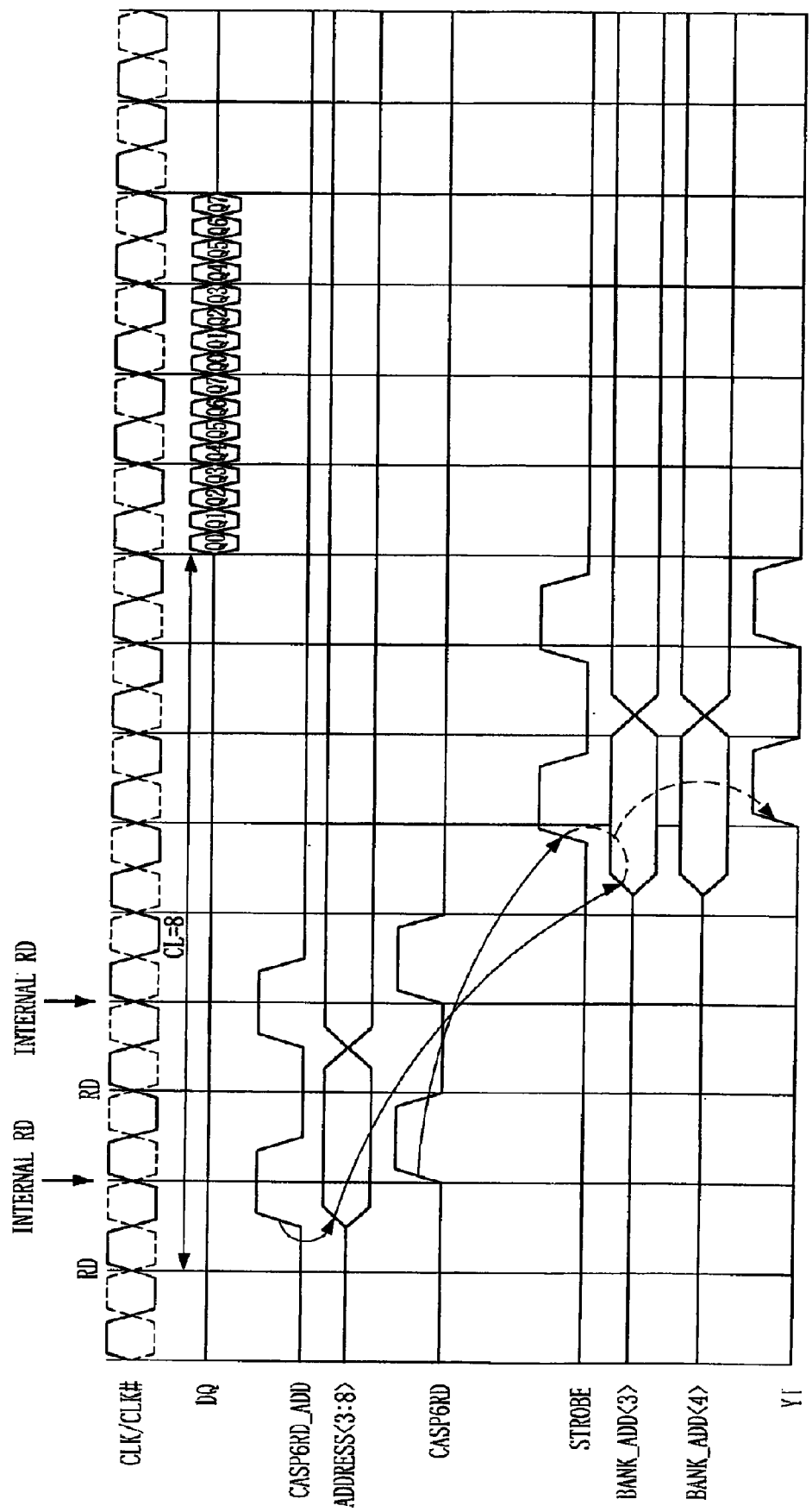
FIG. 2A is a timing diagram of a read operation performed by a semiconductor memory device in accordance with an embodiment of the present invention.

FIG. 2A is a timing diagram of a read operation performed by a semiconductor memory device in accordance with an embodiment of the present invention.

Referring to FIG. 2A, in a read mode, when a read command RD is received from outside, read address latch strobe signal CASP6RD_ADD is activated at a falling edge of a system clock, whereby a column address signal ADDRESS<3:8> is generated. That is, contrary to the typical case, the column address signal ADDRESS<3:8> is generated after 0.5 tCK from when the read command RD was applied and may have an effective window of a width of 2 tCK according to a minimum interval between commands. Meanwhile, a read column access signal CASP6RD, which serves as a source for a column selection signal YI, is generated after 1 tCK from when the read command RD was applied, i.e., after 0.5 tCK from the activation of the column address signal ADDRESS<3:8>. The read column access signal CASP6RD has an active region of a width of 1 tCK. Therefore, the column address signal ADDRESS<3:8> is activated 0.5 tCK sooner than the read column access signal CASP6RD.

An effective window of a column address signal is wider than an active region of a control signal for column access. Accordingly, a sufficient operation margin for performing an internal operation can be secured even if the column address signal ADDRESS<3:8> and the read column access signal CASP6RD are decoded in different circuits, thereby causing time lag therebetween when they are input into the column decoding circuit. That is, the semiconductor memory device in accordance with the embodiment of the present invention can have a sufficient operation margin for performing an internal operation because the active region of the column selection signal YI can exist inside the effective window of the column address signal ADDRESS<3:8> even if delay times of the column address signal ADDRESS<3:8> and the read column access signal CASP6RD are different from each other because of the differences in the number of logic gates and the like within transfer paths and even if the delay times vary with the operation conditions such as a process, a voltage level and a temperature.

Figure 2B:
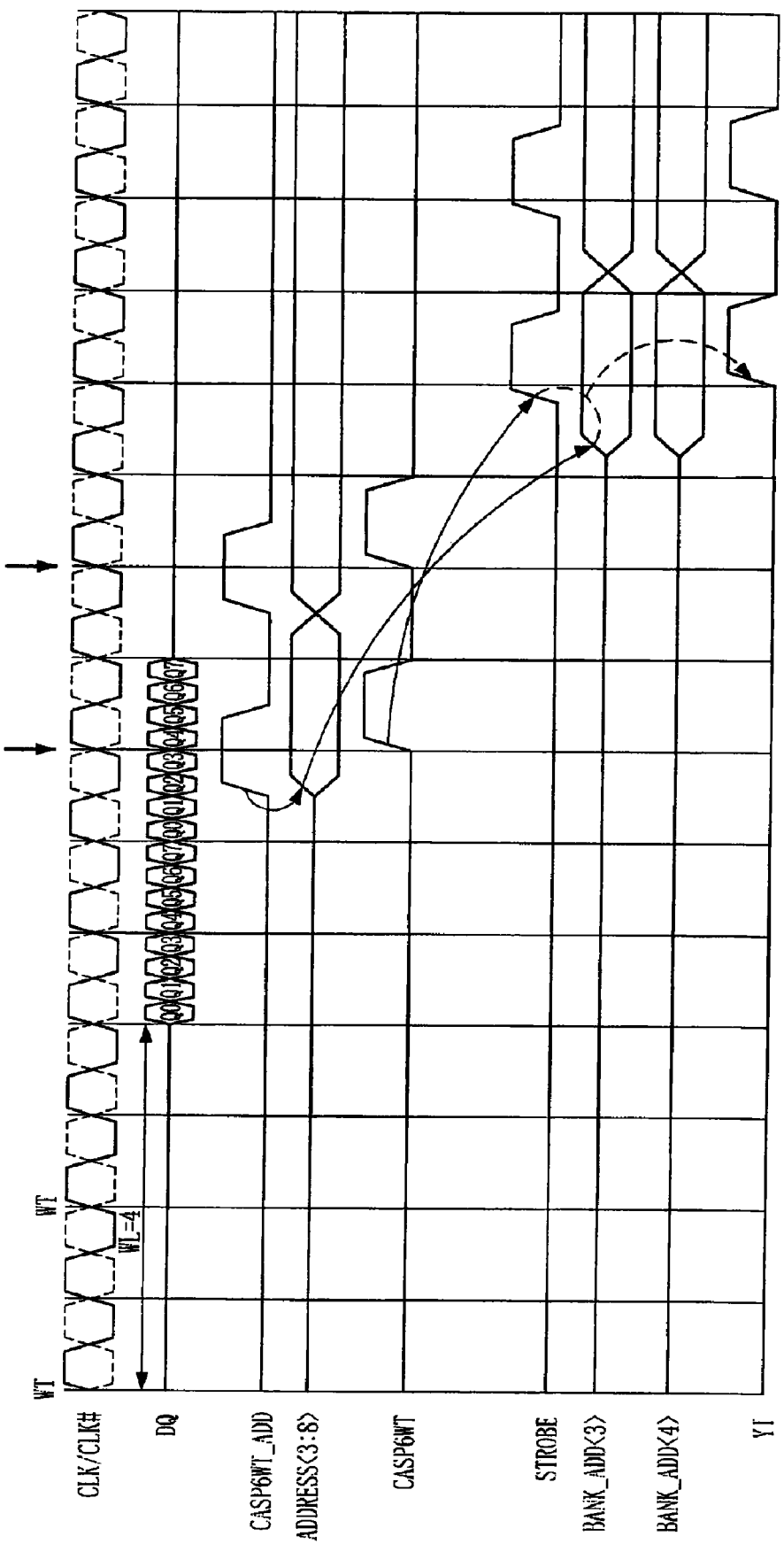
FIG. 2B is a timing diagram of a write operation performed by a semiconductor memory device in accordance with an embodiment of the present invention.

FIG. 2B is a timing diagram of a write operation performed by a semiconductor memory device in accordance with an embodiment of the present invention.

Referring to FIG. 2B, a write operation is similar to the above described read operation. When a write command WT is applied, a column address signal ADDRESS<3:8> and a write column access signal CASP6WT corresponding to the write command WT are sequentially activated after a time interval corresponding to a write latency WL and a burst length BL from the application of the write command WT. The time interval corresponding to the write latency WL and the burst length BL from the application of the write command WT means a time duration spent to receive all data corresponding to the write command WT after receiving the write command WT.

Similarly to the read operation, after 0.5 tCK from receiving the final data (in synchronization with a falling edge of a system clock CLK), a write address latch strobe signal CASP6WT_ADD and thereby a corresponding column address signal ADDRESS<3:8> are generated. A write column access signal CASP6WT is generated after 0.5 tCK from the activation of the write address latch strobe signal CASP6WT_ADD. Pulse widths of an effective window of the column address signal ADDRESS<3:8> and an active region of the write column access signal CASP6WT are the same as those described above with respect to the read operation. Similarly, a sufficient operation margin for performing an internal operation related to a write command WT can also be secured even if the column address signal ADDRESS<3:8> and the write column access signal CASP6WT are decoded in different circuits, thereby generating a time lag therebetween when they are input into internal circuits of a semiconductor memory device.

As described above, the semiconductor memory device in accordance with the embodiment of the present invention can have an operation margin for an internal operation by generating internal signals corresponding to a command signal and an address signal such that they are activated at 0.5 tCK interval although the command signal and the address signal are input into the semiconductor memory device at the same time. A typical semiconductor memory device generates an internal signal controlling the command and an internal signal controlling the address at the same time or generates only a single internal signal controlling both the command and the address. Accordingly, when delay times applied by a circuit generating and transferring the internal signal for controlling the command and a circuit generating and transferring the internal signal for controlling the address are different from each other, an additional delay circuit is required to control times for outputting the internal signals from the circuits. However, such a method is not adequate for a semiconductor memory device operating at high speed, such as GDDR5 and DDR4. In addition, the additional delay circuit may malfunction when its delay time varies with the changes of operation conditions such as a process, a voltage level and a temperature. To solve these problems, the semiconductor memory device in accordance with the embodiment of the present invention generates a strobe signal for generating a column address and a strobe signal related to a command such that the former is activated 0.5 tCK sooner than the latter. Further, the semiconductor memory device synchronizes the signals with the system clock during the decoding and the transferring. Therefore, the semiconductor memory device in accordance with the embodiment of the present invention can minimize a delay that is caused by asynchronous components and varies with operation conditions. Moreover, the semiconductor memory device can secure an optimized operation time by maintaining the time lag of a length of 0.5 tCK even if the two signals are transferred to a bank column decoder, which is a final internal circuit for performing a data access, through different circuit paths.

Figure 3:
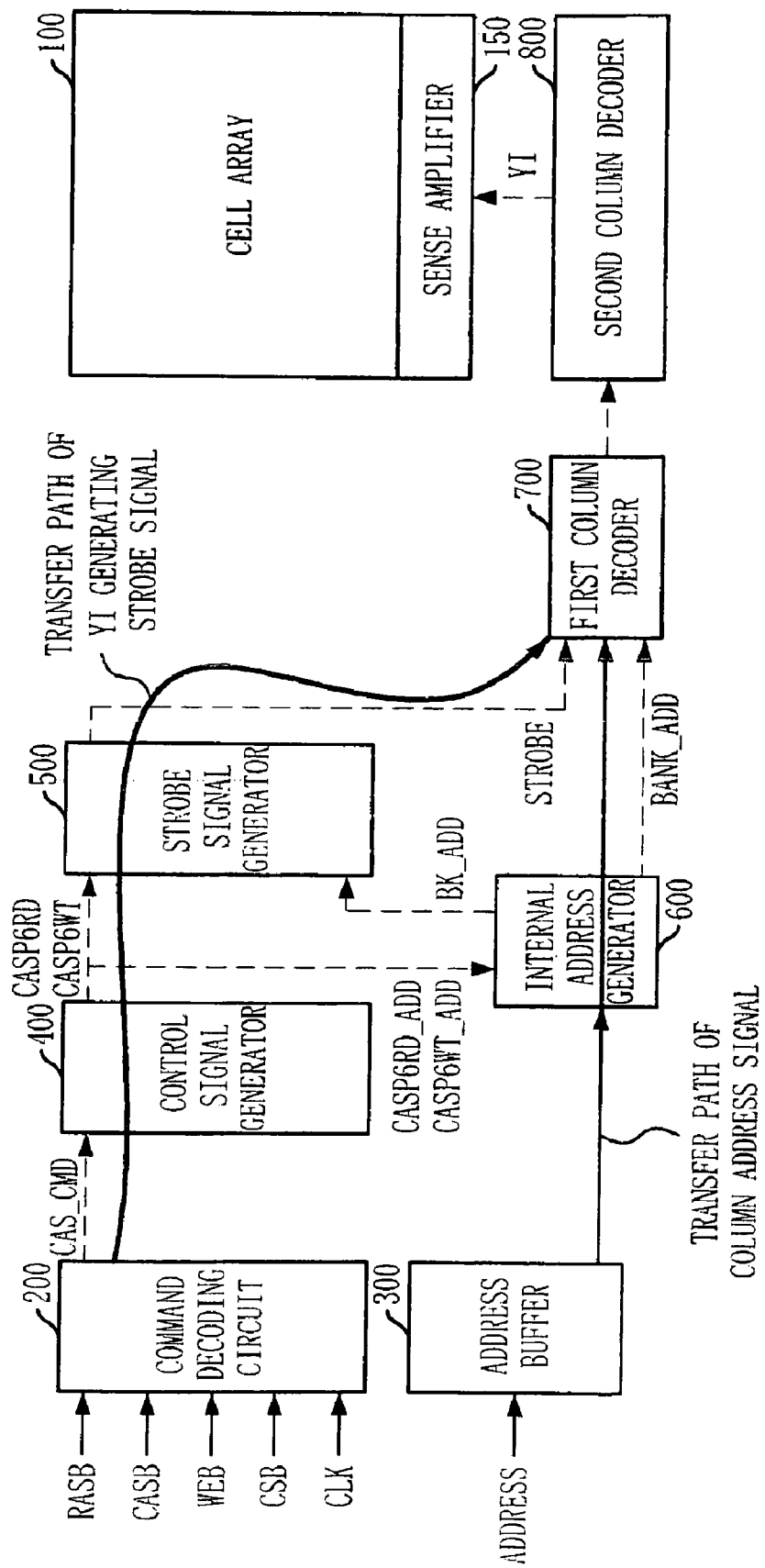
FIG. 3 is a block diagram of a semiconductor memory device in accordance with an embodiment of the present invention.

FIG. 3 is a block diagram of a semiconductor memory device in accordance with an embodiment of the present invention.

Referring to FIG. 3, the semiconductor memory device in accordance with the present invention includes a command decoding circuit 200, a control circuit, and a column decoding circuit. The command decoding circuit 200 decodes an external command to output an internal command signal for an internal operation corresponding to the external command. The control circuit activates, in response to the internal command signal output from the command decoding circuit 200, an internal address signal BANK_ADD corresponding to a received address and a strobe signal STROBE for controlling the internal operations such that the internal address signal BANK_ADD is activated sooner than the strobe signal STROBE. The column decoding circuit generates a data access signal such as a column selection signal YI when both the internal address signal BANK_ADD and the strobe signal STROBE are activated.

The control circuit includes a control signal generator 400, a strobe signal generator 500 and an internal address generator 600. The control signal generator 400 outputs a read address latch strobe signal CASP6RD_ADD and a read column access signal CASP6RD, or a write address latch strobe signal CASP6WT_ADD and a write column access signal CASP6WT in response to the internal command signal output from the command decoding circuit 200. The read address latch strobe signal CASP6RD_ADD and the read column access signal CASP6RD as well as the write address latch strobe signal CASP6WT_ADD and the write column access signal CASP6WT are activated at different times. The strobe generator 500 outputs a strobe signal STROBE in response to the read or write column access signal CASP6RD or CASP6WT. The internal address generator 600 decodes a received address to output an internal address signal BANK_ADD in response to the read address latch strobe signal CASP6RD_ADD or the write address latch strobe signal CASP6WT_ADD. The column decoding circuit includes a column pre-decoder, i.e., a first column decoder 700, and a column decoder, i.e., a second column decoder 800. The column pre-decoder 700 pre-decodes whether the internal address signal BANK_ADD and the strobe signal STROBE are activated or not. The column decoder 800 outputs a column selection signal YI in response to an output of the column pre-decoder 700.

Referring to FIG. 3, the internal address signal BANK_ADD and the strobe signal STROBE are generated and transferred into the column pre-decoder 700 through different paths. A typical semiconductor memory device adopts an additional delay circuit to compensate the delay difference between the different paths. However, the semiconductor memory device in accordance with the present invention does not need the additional delay circuit because the address latch strobe signals CASP6RD_ADD and CASP6WT_ADD and the column access signals CASP6RD and CASP6WT are activated with a time lag of 0.5 tCK therebetween. In addition, the semiconductor memory device in accordance with the present invention can have a stable operation margin because the strobe signal STROBE input into the column pre-decoder 700 has an active region of a width of 1 tCK, the internal address signal BANK_ADD has an effective window of a width of 0.5 tCK and the internal address signal BANK_ADD is activated and inputted 0.5 tCK sooner than the strobe signal STROBE. Particularly, a time lag between the internal address signal BANK_ADD and the strobe signal STROBE caused by variations in operation conditions can also be compensated sufficiently because of the existence of operation margin having a width of 0.5 tCK before and after the activation of the strobe signal STROBE.

Read or write command is input into the command decoding circuit 200 and an address ADDRESS received with the read or write command is input into an address buffer 300. The command decoding circuit 200 combines internal commands RASB, CASB, WEB and CSB corresponding to the read or write command to output an internal command signal, i.e., column access command CAS_CMD, to the control signal generator 400. The address buffer 300 transfers the input address to the internal address generator 600.

Operations of the control signal generator 400 are different depending on whether the external command is a read command or a write command. When the external command is a read command, the control signal generator 400 activates a read address latch strobe signal CASP6RD_ADD for generating an internal address signal BANK_ADD after a half cycle of a system clock CLK from the receiving of the read command, and a read column access signal CASP6RD for generating a strobe signal STROBE after one cycle of the system clock CLK from the receiving of the read command. When the external command is a write command, the control signal generator 400 activates a write address latch strobe signal CASP6WT_ADD for generating an internal address signal BANK_ADD after a half cycle of a system clock CLK from the receiving of a final data corresponding to the write command, and a write column access signal CASP6WT for generating a strobe signal STROBE after one cycle of the system clock CLK from the receiving of a final data corresponding to the write command.

Figure 4:
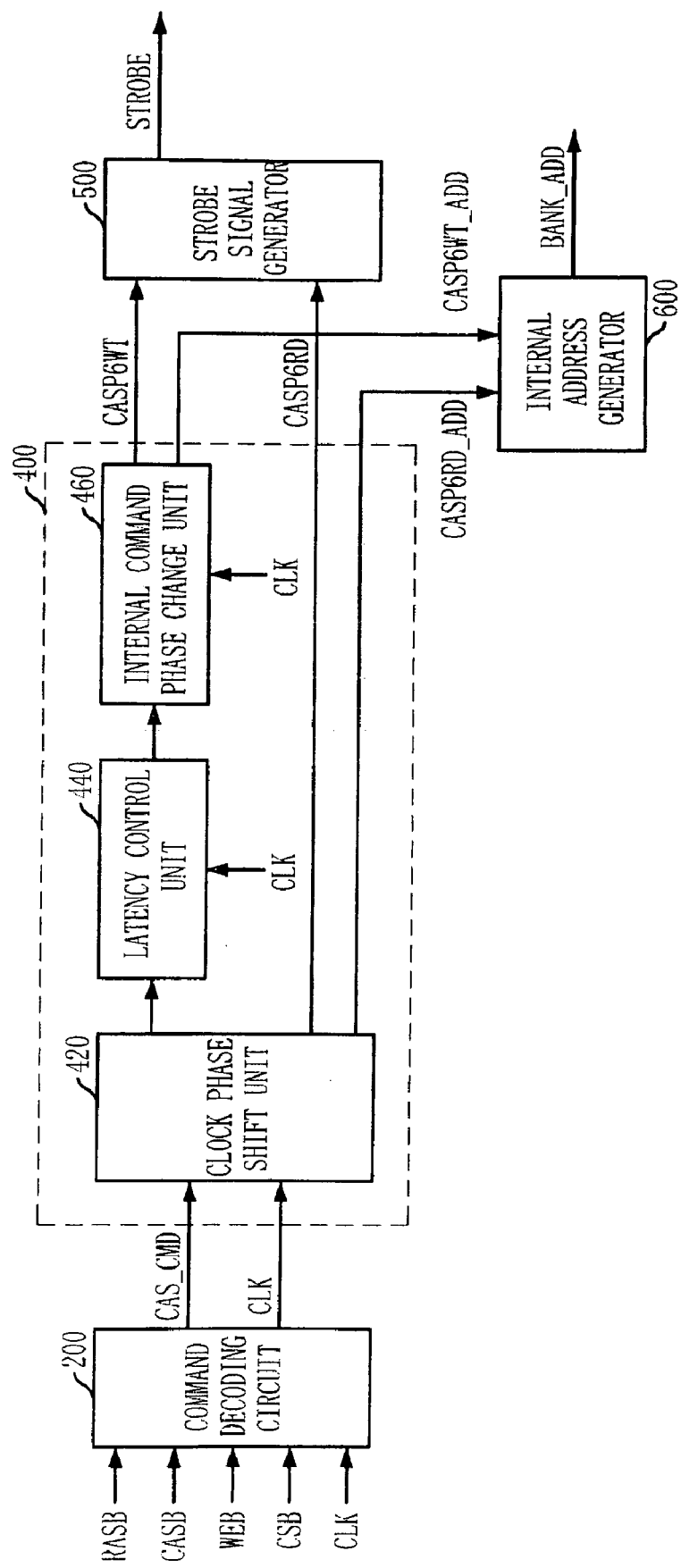
FIG. 4 is a block diagram of a control signal generator of the semiconductor memory device shown in FIG. 3 in accordance with an embodiment of the present invention.

FIG. 4 is a block diagram of a control signal generator 400 of the semiconductor memory device shown in FIG. 3 in accordance with an embodiment of the present invention.

Referring to FIG. 4, the control signal generator 400 includes a clock phase shift unit 420, a latency control unit 440 and an internal command phase change unit 460. The clock phase shift unit 420 generates two signals activated at different times in response to an internal command signal CAS_CMD output from a command decoding circuit 200. The two signals are used as a read address latch strobe signal CASP6RD_ADD and a read column access signal CASP6RD when an external command is a read command. The latency control unit 440 delays an output signal of the clock phase shift unit 420 by a write latency WL from an input time of a write command. The internal command phase change unit 460 delays an output signal of the latency control unit 440 by a burst length BL, and then generates two signals activated at different times. The two signals are used as a write address latch strobe signal CASP6WT_ADD and a write column access signal CASP6WT when the external command is a write command.

The read address latch strobe signal CASP6RD_ADD and the write address latch strobe signal CASP6WT_ADD are activated 0.5 tCK sooner than the read column access signal CASP6RD and the write column access signal CASP6WT respectively. The read column access signal CASP6RD and the write column access signal CASP6WT are input into a strobe signal generator 500. The read address latch strobe signal CASP6RD_ADD and the write address latch strobe signal CASP6WT_ADD are input into an internal address generator 600.

In a read mode, the read column access signal CASP6RD and the read address latch strobe signal CASP6RD_ADD are output by the clock phase shift unit 420 without passing through the latency control unit 440 and the internal command phase change unit 460. When the read command is received from outside, the command decoding circuit 200 outputs the internal command signal CAS_CMD. Then, the clock phase shift unit 420 activates the read address latch strobe signal CASP6RD_ADD in response to the internal command signal CAS_CMD and a falling edge of a system clock. After that, the clock phase shift unit 420 activates the read column access signal CASP6RD in response to the internal command signal CAS_CMD and a next rising edge of the system clock, i.e. after 0.5 tCK from the activation of the read address latch strobe signal CASP6RD_ADD. Accordingly, an internal address signal BANK_ADD is transferred to a column pre-decoder 700 0.5 tCK sooner than a strobe signal STROBE. The internal address signal BANK_ADD has an effective window of a width of 2 tCK and the strobe signal STROBE has an active region of a width of 1 tCK. Accordingly, the semiconductor memory device in accordance with the embodiment of the present invention has an operation margin of a length of 0.5 tCK before and after the active region of the strobe signal STROBE.

In a write mode, the clock phase shift unit 420 outputs a signal without any phase delay in response to the internal command signal CAS_CMD. The latency control unit 440 delays the output signal of the clock phase shift unit 420 by the write latency WL. The internal command phase change unit 460 delays an output signal of the latency control unit 440 by a burst length BL and then outputs the write column access signal CASP6WT and the write address latch strobe signal CASP6WT_ADD such that the write column access signal CASP6WT is activated 0.5 tCK later than the write address latch strobe signal CASP6WT_ADD. After that, the strobe signal generator 500 and the internal address generator 600 outputs the strobe signal STROBE and the internal address signal BANK_ADD in ways similar to those of the read mode.

As described above, the control signal generator 400 of the semiconductor memory device in accordance with the present invention activates the address latch strobe signals CASP6RD_ADD and CASP6WT_ADD 0.5 tCK sooner than the column access signals CASP6RD and CASP6WT. Accordingly, the internal address signal BANK_ADD can be input into the pre-column decode 700 0.5 tCKL sooner than the strobe signal STROBE.

The internal address generator 600 outputs the internal address signal BANK_ADD into the column pre-decoder 700 and outputs the bank address signal BK_ADD into the strobe signal generator 500, in response to the address latch strobe signals CASP6RD_ADD and CASP6WT_ADD. The strobe signal generator 500 receives the column access signals CASP6RD and CASP6WT output from the control signal generator 400 to generate a strobe signal STROBE corresponding to the bank address signal BK_ADD and output it into the column pre-decoder 700. An active region of the strobe signal STROBE is maintained to be the same as those of the column access signal CASP6RD and CASP6WT.

After that, when both the strobe signal STROBE and the internal address signal BANK_ADD are activated, the column pre-decoder 700 outputs a corresponding signal. The column decoder 800 outputs a column selection signal YI for data access in response to the output signal of the column pre-decoder 700. During the process, the semiconductor memory device in accordance with the embodiment of the present invention maintains a time lag between the strobe signal STROBE and the internal address signal BANK_ADD. Therefore, a delay circuit, which may vary a data access time tAA of the semiconductor memory device depending on operation conditions, can be removed from the semiconductor memory device, and whereby the semiconductor memory device can operate at high speed.

Figure 5:
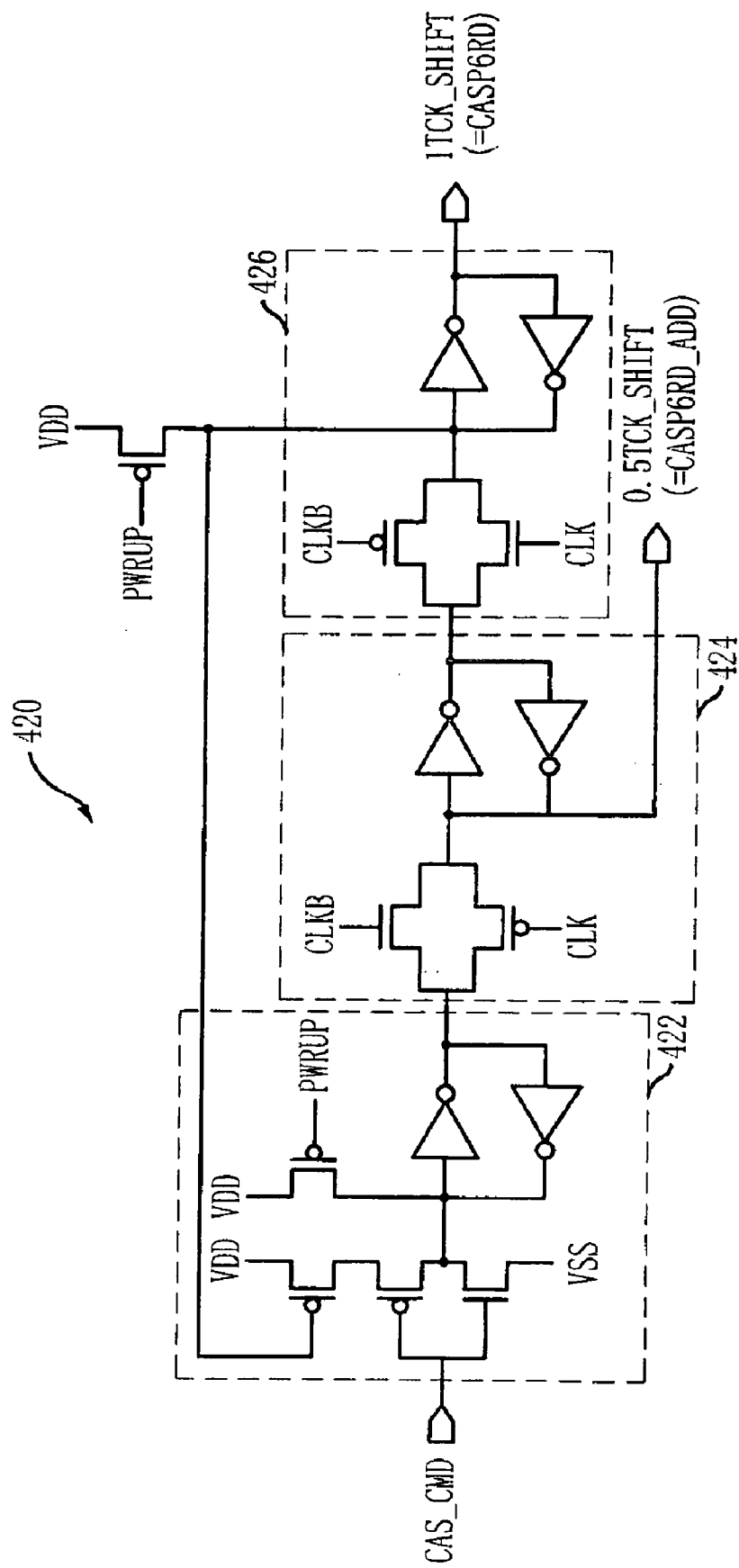
FIG. 5 is a circuit diagram of a clock phase shift unit of the control signal generator shown in FIG. 4 in accordance with an embodiment of the present invention.

FIG. 5 is a circuit diagram of a clock phase shift unit 420 of the control signal generator 400 shown in FIG. 4 in accordance with an embodiment of the present invention. The clock phase shift unit 420 generates signals activated at 0.5 tCK interval in response to an internal command signal CAS_CMD output from a command decoding circuit 200. Hereinafter the operation of the clock phase shift unit 420 in a read mode will be described for example.

Referring to FIG. 5, the clock phase shift unit 420 includes a signal input unit 422, a first pulse generating unit 424 and a second pulse generating unit 426. The signal input unit 420 receives an internal command signal. The first pulse generating unit 424 delays an output signal of the signal input unit 422 by 0.5 tCK to output a read address latch strobe signal CASP6RD_ADD having an active region of a width of 1 tCK. The second pulse generating unit 426 delays an output signal of the first pulse generating unit 424 by 0.5 tCK to output a read column access signal CASP6RD.

Particularly, the signal input unit 422 includes an input unit receiving the output signal of the command decoding circuit 200 to output an inverted signal, and a latch inverting an output signal of the input unit. The input unit and the latch are controlled by a power drive signal PWRUP. When the power drive signal PWRUP is inactivated, the input unit is disabled and the latch transfers a signal of a logic low level. Each of the first pulse generating unit 424 and the second pulse generating unit 426 includes a transfer gate and a latch. The transfer gate of the first pulse generating unit 424 transfers an input signal in response to a falling edge of a system clock CLK while the transfer gate of the second pulse generating unit 426 transfers an input signal in response to a rising edge of the system clock CLK. Because the transfer gate of the first pulse generating unit 424 and the transfer gate of the second pulse generating unit 426 transfer signals at different phases of the system clock, the signal output from the first pulse generating unit 424 and the signal output from the second pulse generating unit 426 have a phase difference of 0.5 tCK to each other.

Contrary to the read mode, in a write mode, an output signal of the signal input unit 422 may be input into the latency control unit 440 without passing through the first pulse generating unit 424 and the second pulse generating unit 426. In this case, the latency control unit 440 delays the output signal of the signal input unit 422 by a write latency WL to output it to an internal command phase change unit 460. Meanwhile, according to another embodiment of the present invention, an output signal of the second pulse generating unit 426 is input into the latency control unit 440. In this case, because the output signal of the second pulse generating unit 426 has been delayed by one cycle of the system clock in the second pulse generating unit, the output signal is delayed in the latency control unit 440 by a delay time which is smaller than the write latency by 1 (i.e., by one cycle of the system clock) before being input into the internal command phase change unit 460. For example, when the write latency is 4, the input signal is delayed by 3 in the latency control unit 440. It will be understood by those skilled in the art that various changes in circuit configuration may be made without departing from the spirit and scope of the present invention. Therefore, detailed descriptions are omitted in this detailed description of the present invention.

Figure 6:
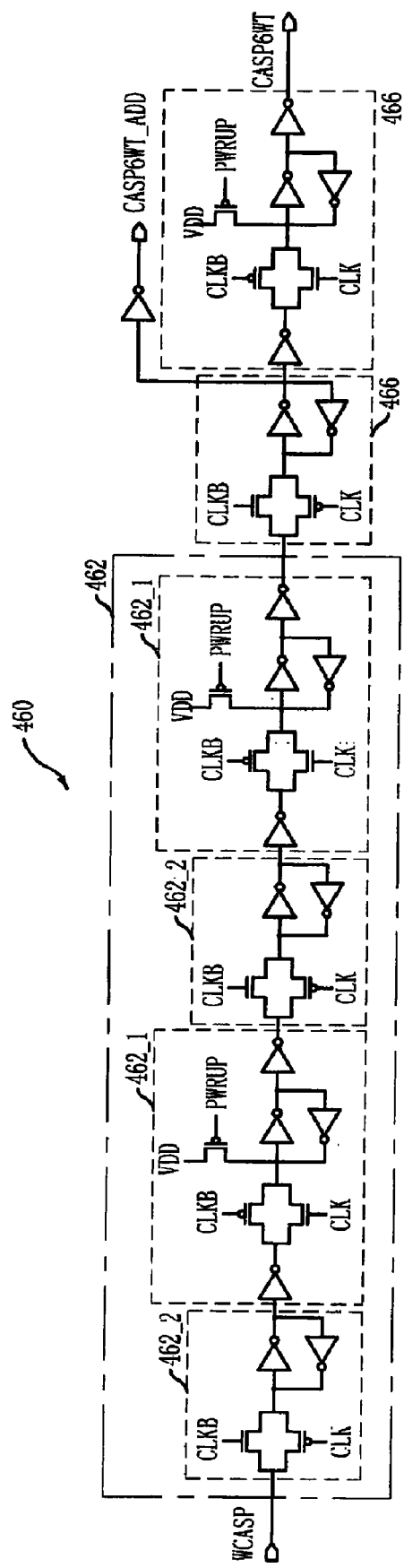
FIG. 6 is a circuit diagram of an internal command phase change unit of the control signal generator shown in FIG. 4 in accordance with an embodiment of the present invention.

FIG. 6 is a circuit diagram of an internal command phase change unit 460 of the control signal generator 400 shown in FIG. 4 in accordance with an embodiment of the present invention.

Referring to FIG. 6, the internal command phase change unit 460 includes a burst delay unit 462, a first pulse output unit 464 and a second pulse output unit 466. The burst delay unit 462 delays an output signal of a latency control unit 440 by a burst length. The first pulse output unit 464 delays an output signal of the burst delay unit 462 by a half cycle of a system clock to output a write address latch strobe signal CASP6WT_ADD. The second pulse output unit 466 delays the write address latch strobe signal CASP6WT_ADD by a half cycle of the system clock to output a write column access signal CASP6WT.

Particularly, the burst delay unit 462 includes one or more first unit delay units 462_1 and one or more second unit delay units 462_2. The first unit delay unit 462_1 transfers an input signal in response to a rising edge of the system clock. The second unit delay unit 462_2 transfers an input signal in response to a falling edge of the system clock. To delay the input signal by a burst length, a number of the first and second delay units 462_1 and 462_2 corresponding to the burst length are interconnected in series by turns. Each of the first and second unit delay units 462_1 and 462_2 includes a transfer gate transferring an input signal in response to the system clock CLK and a latch type buffer latching an output signal of the transfer gate for a predetermined time.

The first and second pulse output units 464 and 466 receives a signal delay by a burst length in the burst delay unit 462 outputs a write address latch strobe signal CASP6WT_ADD and a write column access signal CASP6RD which are activated at an interval of 0.5 tCK. In a read mode, a clock phase shift unit 420 outputs a read address latch strobe signal CASP6RD_ADD and a read column access signal CASP6RD. However, in a write mode, the internal command phase change unit 460 takes the place of the clock phase shift unit 420.

Figure 7:
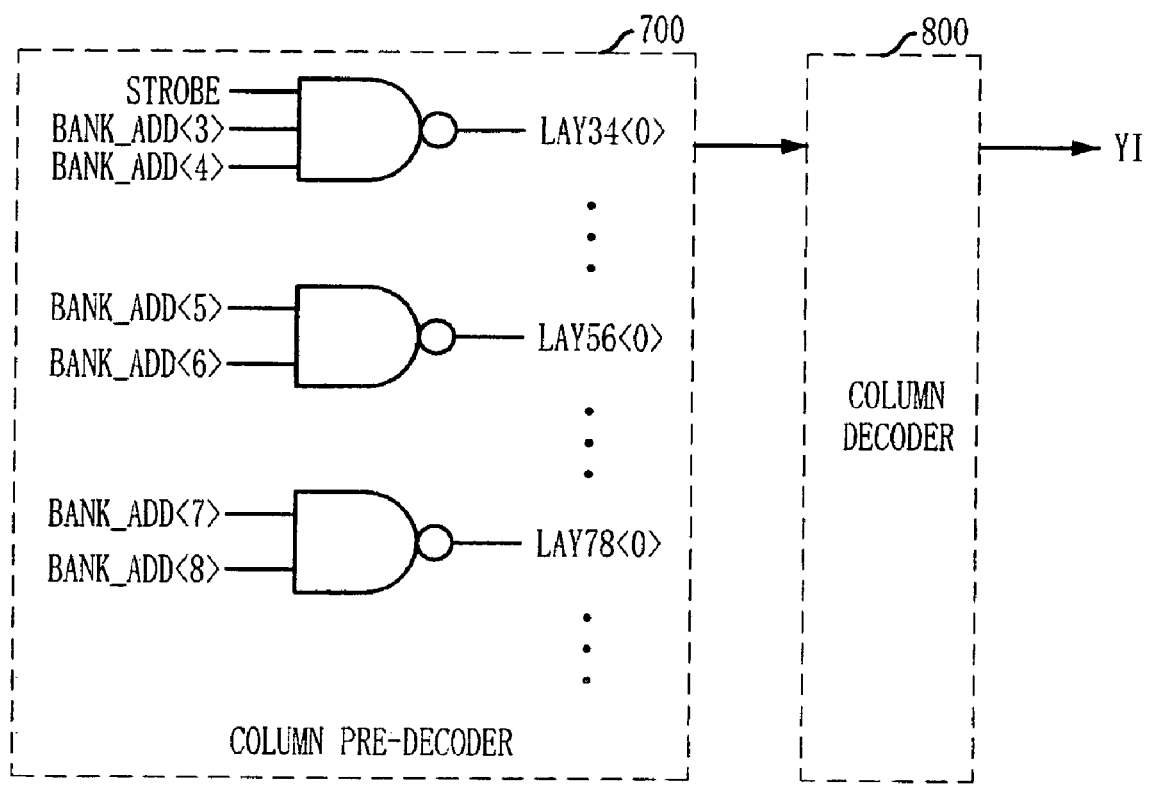
FIG. 7 is a block diagram of a column pre-decoder of the semiconductor memory device shown in FIG. 3 in accordance with an embodiment of the present invention.

FIG. 7 is a block diagram of a column pre-decoder 700 of the semiconductor memory device shown in FIG. 3 in accordance with an embodiment of the present invention.

Referring to FIG. 7, the column pre-decoder 700 pre-decodes whether an internal address signal BANK_ADD and a strobe signal STROBE are activated or not to output a result of the pre-decoding to a column decoder 800. It is relatively easy to match operations between the internal address signal BANK_ADD and the strobe signal STROBE because they are generated with a margin of 0.5 tCK, even though they are input into the column pre-decoder 700 at different times. The column pre-decoder 700 outputs a result of the pre-decoding so that a data access time tAA may be secured sufficiently using the operation margin between the internal address signal BANK_ADD and the strobe signal STROBE. The column decoder 800 receives the result of the pre-decoding to output a column selection signal YI.

The semiconductor memory device in accordance with the embodiment of the present invention can have a sufficient operation margin for data access in spite of variations in operation conditions such as a process, a voltage level, and a temperature.

Furthermore, the semiconductor memory device in accordance with the embodiment of the present invention can synchronize an internal operation corresponding to an external command with an external system clock. Therefore, a reduction of an operation margin caused by asynchronous delay components can be prevented so that a sufficient operation margin can be secured.

While the present invention has been described with respect to the specific embodiments, it will be apparent to those skilled in the art that various changes and modifications may be made without departing from the spirit and scope of the invention as defined in the following claims.

What is claimed is:

1. A semiconductor memory device comprising:
   a command decoding circuit configured to decode an external command to output an internal command signal for an internal operation corresponding to the external command;
   a control circuit configured to generate a strobe signal for controlling the internal operation in response to the internal command signal and generate an internal address signal by decoding an address signal received from an external source in response to the internal command signal wherein the internal address signal is activated earlier than the strobe signal; and
   a column decoding circuit configured to generate a data access signal when both the internal address signal and the strobe signal are activated,
   wherein the control circuit includes:
   a control signal generator configured to output an address latch strobe signal and a column access signal, which signals are activated at different times, in response to the internal command signal;
   a strobe signal generator configured to output the strobe signal in response to the column access signal; and
   an internal address signal generator configured to decode the address signal to output the internal address signal in response to the address latch strobe signal.

2. The semiconductor memory device as recited in claim 1, wherein the address latch strobe signal is activated earlier than the column access signal by a half cycle of a system clock.

3. The semiconductor memory device as recited in claim 1, wherein the control signal generator includes:
   a clock phase shift unit configured to generate two signals activated at different times in response to the internal command signal, wherein the two signals are outputted as the address latch strobe signal and the column access signal when the external command is a read command;
   a latency control unit configured to delay an output signal of the clock phase shift unit by a write latency from an input time of the external command; and
   an internal command phase change unit configured to delay an output signal of the latency control unit by a burst length and generate two signals activated at different times, wherein the two signals are outputted as the address latch strobe signal and the column access signal when the external command is a write command.

4. The semiconductor memory device as recited in claim 3, wherein the clock phase shift unit includes:
   a signal input unit configured to receive the internal command signal;
   a first pulse generating unit configured to delay an output signal of the signal input unit by a half cycle of a system clock to output the address latch strobe signal having an active region a width of which is one cycle of the system clock; and
   a second pulse generating unit configured to delay the address latch strobe signal by a half cycle of the system clock to output the column access signal.

5. The semiconductor memory device as recited in claim 4, wherein the signal input unit includes:
   an input unit configured to receive the internal command signal to output an inverted signal; and a latch configured to invert the output signal of the input unit.

6. The semiconductor memory device as recited in claim 4, wherein each of the first pulse generating unit and the second pulse generating unit includes:
a transfer gate configured to transfer an input signal in response to the system clock; and
a latch configured to latch an output signal of the first transfer gate.

7. The semiconductor memory device as recited in claim 3, wherein the internal command phase change unit includes:
a burst delay unit configured to delay the output signal of the latency control unit by the burst length;
a first pulse output unit configured to delay an output signal of the burst delay unit by a half cycle of the system clock to output the address latch strobe signal; and
a second pulse output unit configured to delay the address latch strobe signal by a half cycle of a system clock to output the column access signal.

8. The semiconductor memory device as recited in claim 7, wherein the burst delay unit includes:
one or more first unit delay units each being configured to transfer an input signal in response to a rising edge of the system clock; and
one or more second unit delay units each being configured to transfer an input signal in response to a falling edge of the system clock,
wherein the first and second delay units are alternately connected in series and the number of the first and second delay units corresponds to the burst length.

9. The semiconductor memory device as recited in claim 8, wherein each of the first and second unit delay units includes:
a transfer gate configured to transfer an input signal in response to the system clock; and
a latch type buffer configured to latch an output signal of the transfer gate for a predetermined time.

10. The semiconductor memory device as recited in claim 3, wherein the latency control unit is configured to delay the output signal of the clock phase shift unit, which was generated by delaying the internal command signal by one cycle of a system clock in the clock phase shift unit, by a delay time one cycle smaller than a predetermined write latency.

11. The semiconductor memory device as recited in claim 3, wherein the latency control unit is configured to delay the output signal of the clock phase shift unit, which was generated from the internal command signal without any delay in the clock phase shift unit, by a predetermined write latency.

12. The semiconductor memory device as recited in claim 1, wherein the column decoding circuit includes:
a column pre-decoder configured to pre-decode whether the internal address signal and the strobe signal are activated or not; and
a column decoder configured to output a column selection signal in response to an output of the column pre-decoder.

13. The semiconductor memory device as recited in claim 1, wherein the internal address signal is activated earlier than the strobe signal by a half cycle of a system clock.

14. The semiconductor memory device as recited in claim 13, wherein when the external command is a read command, an address latch strobe signal for generating the internal address signal is activated after a half cycle of the system clock from when the external command is received, and a column access signal for generating the strobe signal is activated after one cycle of the system clock from when the external command is received.

15. The semiconductor memory device as recited in claim 13, wherein when the external command is a write command, an address latch strobe signal for generating the internal address signal is activated after a half cycle of the system clock from when the final data corresponding to the external command is received, and a column access signal for generating the strobe signal is activated after one cycle of the system clock from when the final data corresponding to the external command is received.

16. The semiconductor memory device as recited in claim 1, wherein the data access signal is a column selection signal having an active region a width of which corresponds to one cycle of a system clock, and the internal address signal has an effective window a width of which corresponds to two cycles of the system clock.

17. An operation method of a semiconductor memory device, the operation method comprising:
decoding an external command to output a CAS (column address strobe) command signal for an internal operation corresponding to the external command;
generating a strobe signal for controlling the internal operation in response to the CAS command signal and an internal address signal by decoding an address signal received from an external source in response to the CAS command signal wherein the internal address signal is activated earlier than the strobe signal; and
generating a data access signal when both the internal address signal and the strobe signal are activated,
wherein the generating of the strobe signal and the internal address signal includes:
outputting an address latch strobe signal and a column access signal, which are activated at different tunes, in response to the CAS command signal;
outputting the strobe signal in response to the column access signal; and
decoding the address signal to output the internal address signa1 in response to the address latch strobe signal.

18. The operation method as recited in claim 17, wherein the outputting of the address latch strobe signal and the column access signal includes:
generating two signals activated at different times in response to the CAS command signal and outputting the two signals as the address latch strobe signal and the column access signal used when the external command is a read command;
delaying the column access signal by a write latency from an input time of the external command; and
delaying the delayed column access signal by a burst length, generating two signals activated at different times, and outputting the two signals as the address latch strobe signal and the column access signal used when the external command is a write command.

19. The operation method as recited in claim 18, wherein the address latch strobe signal is activated earlier than the column access signal by a half cycle of a system clock.

20. The operation method as recited in claim 17, wherein when the external command is a read command, an address latch strobe signal for generating the internal address signal is activated after a half cycle of a system clock from when the external command is received, and a column access signal for generating the strobe signal is activated after one cycle of the system clock from when the external command is received.

21. The operation method as recited in claim 17, wherein when the external command is a write command, an address latch strobe signal for generating the internal address signal is activated after a half cycle of a system clock from when the final data corresponding to the external command is received, and a column access signal for generating the strobe signal is activated after one cycle of the system clock from when the final data corresponding to the external command is received.

* * * * *